United States Patent [19]

Stefani

[11] Patent Number: 4,888,563
[45] Date of Patent: Dec. 19, 1989

[54] AUDIO AMPLIFIER HAVING A LOW-NOISE INPUT STAGE

[75] Inventor: Fabrizio Stefani, Varese, Italy

[73] Assignee: SGS-Thomas Microelectronics S.r.L., Agrate Brianza, Italy

[21] Appl. No.: 283,233

[22] Filed: Dec. 12, 1988

[30] Foreign Application Priority Data

Dec. 22, 1987 [IT] Italy ................................ 23163 A/87

[51] Int. Cl.$^4$ .............................................. H03F 3/04
[52] U.S. Cl. .................................... 330/296; 330/288
[58] Field of Search ................ 323/315, 316; 330/149, 330/288, 296, 307, 310, 311, 9

[56] References Cited

U.S. PATENT DOCUMENTS 4,334,198 6/1982 Malchow ........................ 330/288 X Primary Examiner—Stephen Mottola
Attorney, Agent, or Firm—Rosen, Dainow & Jacobs

[57] ABSTRACT

An audio amplifier having a low-noise input stage, being of a type which comprises a gain stage and an output stage cascade connected downstream from said input stage which includes first and second transistors having their respective bases connected to each other via corresponding input resistors, with the base of the first transistor also adapted to constitute a signal input for the amplifier, further comprises an electric connection between the collector of said second transistor and said input resistors to define a diode configuration for that second transistor, thereby the offset effect of the input resistors can be compensated for, and the noise voltage at the output from the amplifier downed.

4 Claims, 2 Drawing Sheets

AUDIO AMPLIFIER HAVING A LOW-NOISE INPUT STAGE

DESCRIPTION

This invention relates to an audio amplifier having a low-noise input stage, being of a type which comprises a gain stage and an output stage cascade connected downstream from said input stage, said input stage including first and second transistors having their respective bases connected to each other via corresponding input resistors, with the base of the first transistor also adapted to provide a signal input for said amplifier.

As is known, audio amplifiers require that the output voltage $V_{out}$ be equal to one half the amplifier voltage supply $V_c$ in order for the waveform of the output signal to be symmetrical.

To fill that demand, the prior art has proposed a first solution as disclosed, for example, in Italian Patent Application No. 20337-A/87 by this same Applicant. That Application describes a so-called bridge type audio amplifier which comprises a power amplifier in a non-inverting configuration with a feedback resistor between the output and the inverting input, via an input resistor, and a further resistor between the input resistor and ground. That amplifier also comprises an additional input resistor on the non-inverting input which is grounded with a fourth resistor which forms with the previously mentioned ones a bridge circuit.

This prior technical solution, while substantially serving its purpose, has two major drawbacks as pointed out herein below.

The offset of the output voltage $V_{out}$ relatively to the half-voltage supply $V_c$ is equal to the offset at the amplifier input multiplied by its loop gain $G_v$.

The so-called noise voltage at the amplifier output is equal to the input noise voltage multiplied by the gain $G_v$.

Since the main source of offset is the presence of the input resistor at the inverting input of the amplifier, the prior art proposes of compensating for such an effect by arranging for the other resistor on the non-inverting input to have the same value as that on the inverting input. However, such resistors have a high value on the order of about 50 kOhms, and the offset compensation results in an increased noise voltage that adds to the inherent noise of the amplifier input stage.

The technical problem which underlies this invention is to devise and provide an audio amplifier having a low-noise input stage, which also allows of compensating for the offset effect produced by the input resistance $R_{in}$, while obviating the drawbacks with which the cited prior art is beset.

This problem is solved by an amplifier as indicated being characterized in that it comprises an electric connection between the collector of said second transistor and said input resistors to define a diode configuration for that second transistor.

The features and advantages of an audio amplifier according to the invention will be apparent from the following detailed description of an embodiment thereof, to be taken by way of example and not of limitation in conjunction with the accompanying drawings:

Figure 1:
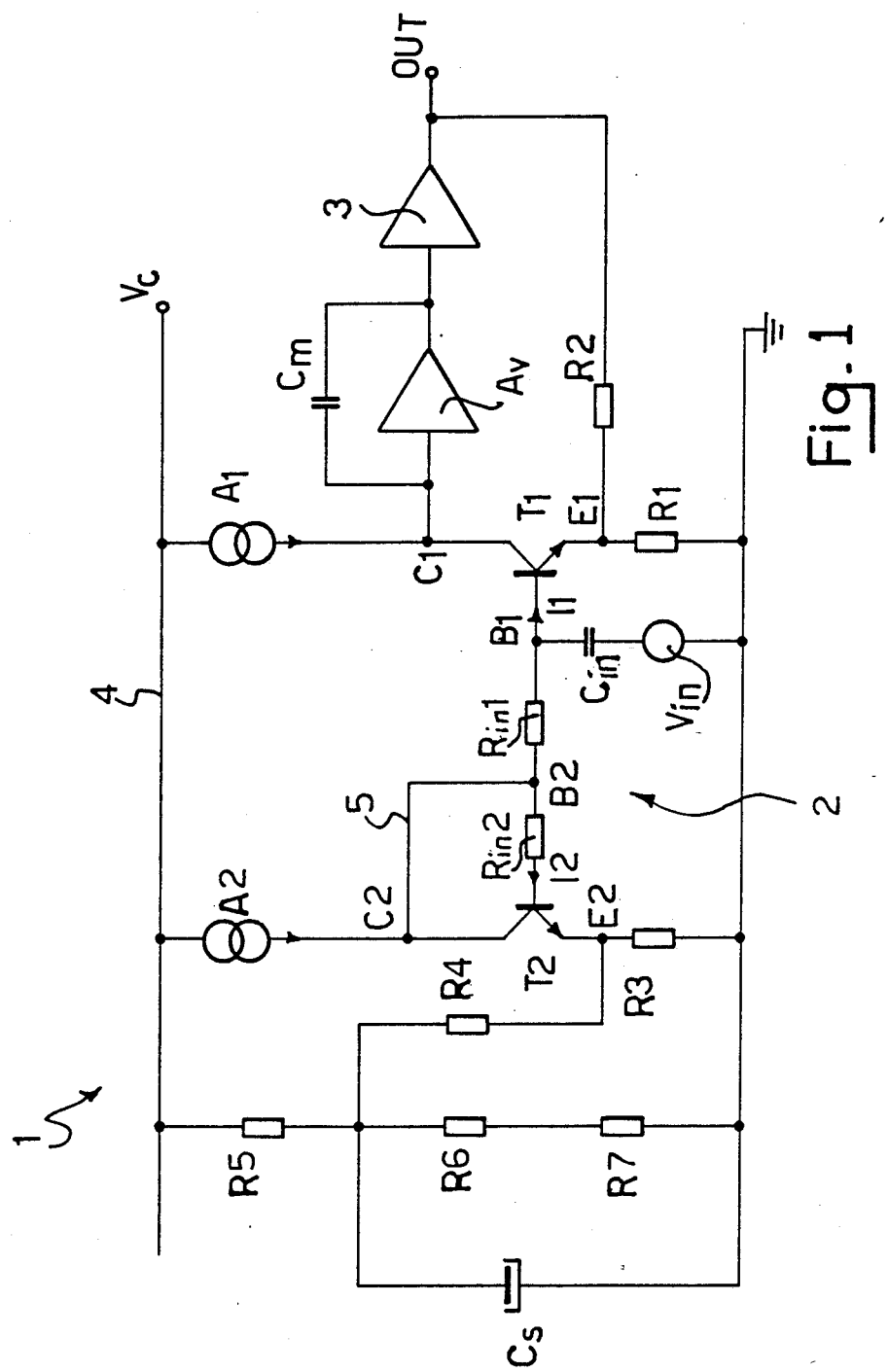
FIG. 1 is a schematical view of the amplifier according to this invention.

With reference to the drawing views, the numeral 1 comprehensively and schematically designates an audio amplifier having, in accordance with this invention, a low-noise input stage 2.

The amplifier 1 comprises a gain and integrating stage $A_v$ which is fed back across the input and the output by means of a capacitor $C_m$ and has the output connected to an output stage 3. The output OUT of the stage 3 constitutes an output for the amplifier 1.

The gain stage $A_v$ has its input connected, via a current source A1, to a power supply line 4 connected to a positive supply pole $V_c$.

That input is also connected to the collector C1 of an npn-type transistor T1 having its emitter E1 connected to ground via a resistor R1.

The base B1 of that transistor T1 constitutes a signal input, more specifically a non-inverting (+) input, for the amplifier 1 and is connected to ground through a capacitor $C_{in}$ serially connected to a signal source consisting of the voltage source $V_{in}$.

The output OUT of the amplifier 1 is connected in feedback to the emitter E1 of the transistor T1 via a resistor R2.

Connected to the base B1 of the transistor T1 is one end of an input resistor $R_{in}1$ of the amplifier 1 which has the other end connected to the base B2 of a second npn-type transistor R2 via a second input resistor $R_{in}2$.

The base B2 constitutes a second inverting (−) input for the amplifier 1, and the transistor T2 has its emitter E2 grounded through a resistor R3 having the same value as the resistor R1. In addition, that transistor T2 has its collector C2 connected to the power supply line 4 via a current source A2 having the same value as the source A1.

An electric connection 5 is advantageously provided between the collector C2 of the transistor T2 and the point of connection of the input resistors $R_{in}1$ and $R_{in}2$, thereby the transistor T2 is in a diode configuration.

To supplement the connections between the amplifier 1 and the voltage supply $V_c$, there is provided a resistor R4 having the same value as the resistor R2 and being connected between the emitter E2 of the transistor T2 and the line 4 via a further resistor R5. That resistor R5 value is the same as that of the resistors R1 and R2 serially combined together. In addition, the resistor R4 is connected to ground via the series of two resistors R6 and R7 whose values are equal to those of the resistors R1 and R2, respectively. A capacitor $C_s$ is parallel connected to the series of the resistors R6 and R7.

Under normal operating conditions, through the bases B1 and B2 of the respective transistors T1 and T2 in the input stage 2 there flow currents as indicated at I1 and I2.

The audio amplifier of this invention operates in the following manner. The offset voltage at the amplifier inputs is given by the product of the base currents I1 and I2 of the transistors T1 and T2 by the corresponding input resistances $R_{in}1$ and $R_{in}2$.

Accordingly, by using input resistors of equal values, i.e. having $R_{in}1 = R_{in}2$, like voltage drops are obtained and the offset effect is compensated for.

As regards instead the noise voltage, it should be considered that the transistor T2 is in a diode configuration and functions, therefore, as ground for the signal voltage supply $V_{in}$.

More specifically, if the transconductance of the transistor T2 is denoted $g_m$, as far as the signal is concerned, that transistor is the equivalent of a resistor whose value is $1/g_m$.

The impedance of the signal input of the amplifier is equal to the sum of the input resistance $R_{in}1$ of the inverse of the transconductance $g_m$ plus the parallel of the resistances R1 and R2. Inasmuch as the two last-named contributions are negligible compared to the resistance $R_{in}1$, which can be made sufficiently high, it follows that the amplifier input impedance closely approximates $R_{in}1$ alone.

Since the noise voltage generated by this resistor $R_{in}1$, as well as the resistor $R_{in}2$ is filtered out to ground by the capacitor $C_{in}$, said resistors will contribute no output noise.

Furthermore, the input stage 2 includes a very small number of active and passive components which contribute only a minor output noise.

Figure 2:
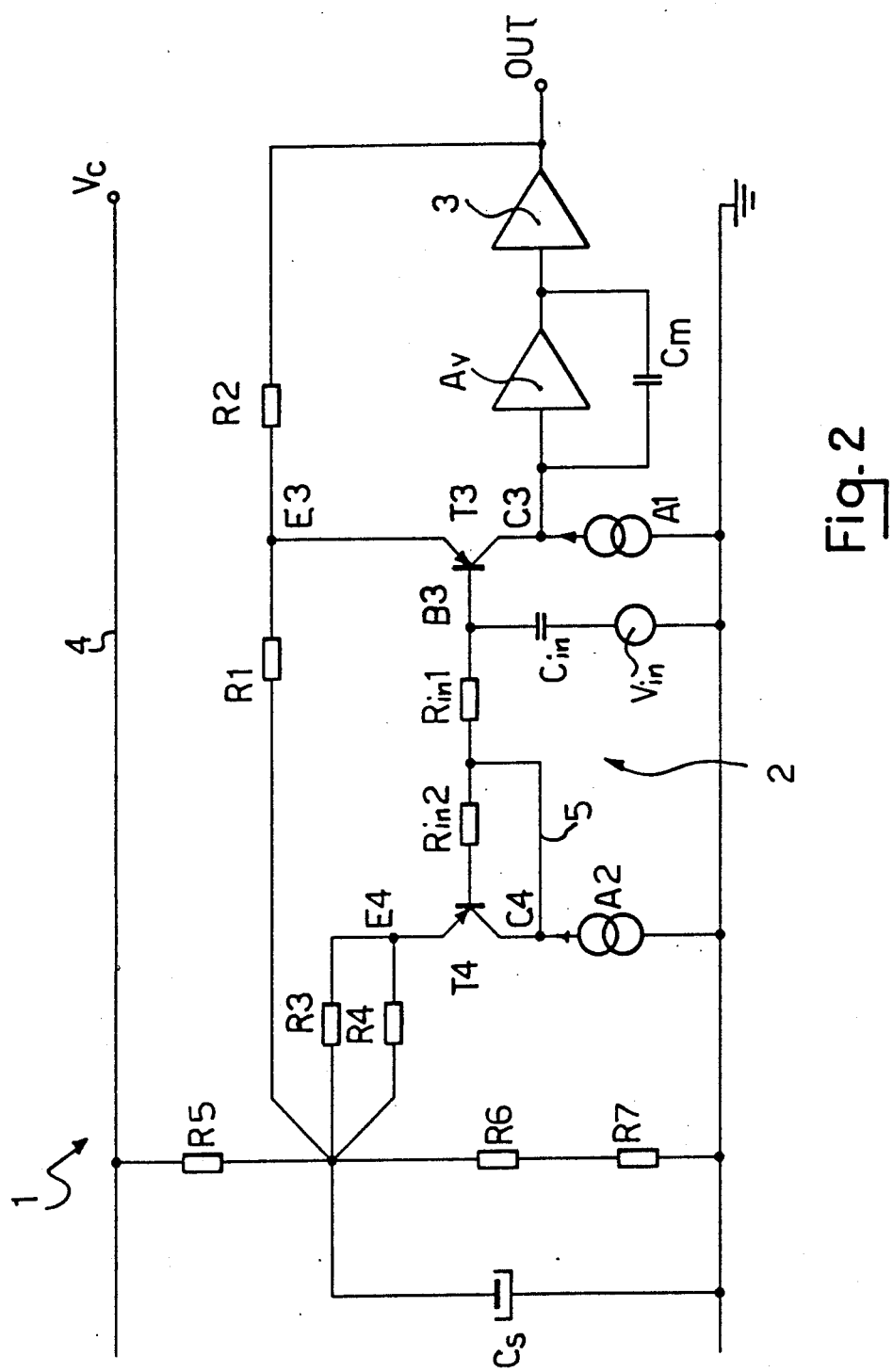
FIG. 2 is a schematical view of a variation of the amplifier embodiment shown in FIG. 1.

With particular reference to FIG. 2, there is shown a schematical view of a variation of the embodiment of the inventive amplifier, wherein cooperating parts and items which have the same constructions and functions as in the preceding exemplary embodiment carry the same reference characters.

In this variation, active elements are provided for the input stage 2 which comprise pnp-type transistors T3 and T4 having their respective collectors C3 and C4 connected to ground via the current sources A1 and A2. In addition, the connections between such transistors and the supply pole $V_c$ are true duplicates of the preceding exemplary embodiment.

The operation of this variation of the amplifier 1 is quite the equivalent of what has been described above in relation to the preferred embodiment.

The audio amplifier of this invention has a major advantage in that it affords a very low output noise while compensating for the offset effect. Furthermore, the input stage of this amplifier allows for operation on a specially low supply voltage to enhance savings on the energy input and low power dissipation.

I claim:

1. An audio amplifier comprising a low-noise input stage, a gain stage connected to the input stage, and an output stage cascade connected downstream from said gain stage; said input stage comprising first and second transistors having respective base, emitter and collector electrodes, first and second input resistors connected in series between the respective base electrodes of the first and second transistors, means for connecting a signal input for said amplifier to the base electrode of the first transistor, said first transistor being connected in a common emitter configuration with its collector electrode connected to the gain stage and serving as an input to the gain stage, and means for electrically connecting the collector electrode of said second transistor to a node between the series connection of the first and second input resistors whereby said second transistor is in a diode configuration.

2. An amplifier according to claim 1, further comprising a signal input source constituting the signal input of said amplifier, a capacitor, means connecting the base electrode of the first transistor in series with the capacitor and the signal input source to a point of reference potential.

3. An amplifier according to claim 1, wherein the first and second input resistors have the same value whereby the diode configuration of the second transistor functions as a point of reference potential for the signal input to the first transistor base.

4. An amplifier as claimed in claim 3, further comprising third and fourth resistances of the same value respectively connecting the first and second transistor emitters to the point of reference potential.

* * * * *

UNITED STATES PATENT AND TRADEMARK OFFICE
CERTIFICATE OF CORRECTION

PATENT NO. : 4,888,563

DATED : December 19, 1989

INVENTOR(S) : Fabrizio Stefant

It is certified that error appears in the above-identified patent and that said Letters Patent is hereby corrected as shown below:

On the title page:

The name of the Assignee (item(73) in the left column of the cover page) "SGS-Thomas Microelectronics S.r.L.," should read --SGS-Thomson Microelectronics S.r.l.--.

Signed and Sealed this

Thirty-first Day of December, 1991

Attest:

HARRY F. MANBECK, JR.

*Attesting Officer*      *Commissioner of Patents and Trademarks*